(12) United States Patent
Fukuda

(10) Patent No.: US 10,505,090 B2
(45) Date of Patent: Dec. 10, 2019

(54) PACKAGE INCLUDING LEAD COMPONENT HAVING RECESS

(71) Applicant: NICHIA CORPORATION, Anan-shi, Tokushima (JP)

(72) Inventor: Mayumi Fukuda, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/471,324

(22) Filed: Mar. 28, 2017

(65) Prior Publication Data

US 2017/0200878 A1    Jul. 13, 2017

Related U.S. Application Data

(62) Division of application No. 14/867,096, filed on Sep. 28, 2015, now Pat. No. 9,640,743.

(30) Foreign Application Priority Data

Sep. 29, 2014   (JP) .................................. 2014-198743
Jul. 27, 2015   (JP) .................................. 2015-147971

(51) Int. Cl.
*H01L 33/62*    (2010.01)
*B29C 45/14*    (2006.01)
(Continued)

(52) U.S. Cl.
CPC ........ *H01L 33/62* (2013.01); *B29C 45/14655* (2013.01); *H01L 33/005* (2013.01);
(Continued)

(58) Field of Classification Search
CPC .......................................... B29C 2045/14672
See application file for complete search history.

(56) References Cited

U.S. PATENT DOCUMENTS

2008/0012036 A1   1/2008 Loh et al.
2008/0121921 A1   5/2008 Loh et al.
(Continued)

FOREIGN PATENT DOCUMENTS

CN    204130589 U    1/2015
JP    10-209192 A    8/1998
(Continued)

OTHER PUBLICATIONS

Extended European Search Report of the corresponding European Patent Application No. 15187159.7, dated Feb. 2, 2016.

*Primary Examiner* — Steven B Gauthier
(74) *Attorney, Agent, or Firm* — Global IP Counselors, LLP

(57) ABSTRACT

A package includes a first electrode, a second electrode, a wall, and a flange. The polarity of the second electrode is different from that of the first electrode, and at least one of the first electrode and the second electrode has an outer lead component that has a recess formed at a distal end. The wall fixes the first electrode and the second electrode, constitutes a side wall of a bottomed concave component in which at least part of a bottom surface of the bottomed concave component is constituted by the first electrode and the second electrode, and has the outer lead component protruded therefrom. The flange protrudes outward from the wall, and is provided with the same thickness as the outer lead component, on two sides of the outer lead component in plan view where the recess is not formed.

14 Claims, 12 Drawing Sheets

(51) Int. Cl.
  *H01L 33/00* (2010.01)
  *H01L 33/54* (2010.01)
  *H01L 33/60* (2010.01)
  *H01L 33/32* (2010.01)
  *H01L 33/48* (2010.01)
  *H01L 33/56* (2010.01)

(52) U.S. Cl.
  CPC ............ *H01L 33/32* (2013.01); *H01L 33/486* (2013.01); *H01L 33/54* (2013.01); *H01L 33/56* (2013.01); *H01L 33/60* (2013.01); *B29C 2045/14672* (2013.01); *H01L 2224/48091* (2013.01); *H01L 2224/48247* (2013.01); *H01L 2933/005* (2013.01); *H01L 2933/0058* (2013.01); *H01L 2933/0066* (2013.01)

(56) References Cited

U.S. PATENT DOCUMENTS

| | | |
|---|---|---|
| 2009/0114936 A1* | 5/2009 | Kashiwao ............... H01L 33/60 257/98 |
| 2009/0315068 A1 | 12/2009 | Oshio et al. |
| 2011/0127566 A1* | 6/2011 | Yoon ..................... H01L 33/486 257/99 |
| 2011/0210354 A1 | 9/2011 | Ichikawa et al. |
| 2011/0233579 A1 | 9/2011 | Loh et al. |
| 2011/0303941 A1 | 12/2011 | Lee |
| 2012/0012879 A1 | 1/2012 | Loh et al. |
| 2012/0104426 A1* | 5/2012 | Chan .................. H01L 25/0753 257/89 |
| 2012/0205712 A1 | 8/2012 | Hayashi |
| 2013/0299854 A1* | 11/2013 | Lee ......................... H01L 33/62 257/88 |
| 2014/0054629 A1* | 2/2014 | Kim ........................ H01L 27/15 257/91 |
| 2014/0203304 A1 | 7/2014 | Kim et al. |

FOREIGN PATENT DOCUMENTS

| | | |
|---|---|---|
| JP | 10-209912 A | 8/1998 |
| JP | 2003-158234 A | 5/2003 |
| JP | 2008-072092 A | 3/2008 |
| JP | 2008-182242 A | 8/2008 |
| JP | 2009-021394 A | 1/2009 |
| JP | 2010062272 A | 3/2010 |
| JP | 2010-186896 A | 8/2010 |
| JP | 2011-103437 A | 5/2011 |
| JP | 2011-119729 A | 6/2011 |
| JP | 2011-233928 A | 11/2011 |
| JP | 2012-039162 A | 2/2012 |
| JP | 2013-051296 A | 3/2013 |
| JP | 2013-077813 A | 4/2013 |
| JP | 2013-161903 A | 8/2013 |
| JP | 2013-183013 A | 9/2013 |
| JP | 2015-005584 A | 1/2015 |
| KR | 2009-0131643 A | 12/2009 |
| KR | 2012-005283 A | 5/2012 |
| KR | 2012-0050283 A | 5/2012 |
| KR | 2012-0550283 A | 5/2012 |
| KR | 2014-0026877 A | 3/2014 |

\* cited by examiner

PACKAGE INCLUDING LEAD COMPONENT HAVING RECESS

CROSS-REFERENCE TO RELATED APPLICATIONS

This application is a divisional application of U.S. patent application Ser. No. 14/867,096, filed on Sep. 28, 2015. This application claims priority to Japanese Patent Application Nos. 2014-198743 and 2015-147971 filed on Sep. 29, 2014 and Jul. 27, 2015. The entire disclosures of U.S. patent application Ser. No. 14/867,096, Japanese Patent Application Nos. 2014-198743 and 2015-147971 are hereby incorporated herein by reference.

BACKGROUND

1. Field of the Invention

The present invention relates to a method for manufacturing a package, a method for manufacturing a light emitting device, a package and a light emitting device.

2. Description of Related Art

In the past, a package including a lead frame used to be manufactured by injecting a thermoplastic resin from the back side (for example, JP2010-186896A and JP2013-051296A). After the resin was cured, the lead frame was bent to form a light emitting device.

It is also known to inject a resin into a cavity for each lead frame of molding dies, cure the resin, and mold the resin integrally with each lead frame to form a package (for example, JP2013-077813A). With this package manufacturing method, the lead frames are bent ahead of time, prior to placement in the molding die.

With the light emitting device discussed above, since the resin is injected from the back side of the lead frame, the package ended up being thick. This in turn led to greater thickness of the light emitting device in which the package was used. Furthermore, a conventional light emitting device entailed going to the trouble of bending or otherwise working the lead frame of the package.

There are need for a manufacturing method with which a package and a light emitting device can be manufactured easily and in a thin size, as well as a package and a light emitting device with a thin size.

SUMMARY

An object of the present disclosure is to provide a manufacturing method with which a package and a light emitting device can be manufactured easily and in a thin size, as well as a package and a light emitting device with a thin size.

A package according to one embodiment includes a first electrode, a second electrode, a wall, and a flange. The polarity of the second electrode is different from that of the first electrode, and at least one of the first electrode and the second electrode has an outer lead component that has a second recess formed at a distal end. The wall fixes the first electrode and the second electrode, constitutes a side wall of a bottomed concave component in which at least part of a bottom surface of the bottomed concave component is constituted by the first electrode and the second electrode, and has the outer lead component protruded therefrom. The flange protrudes outward from the wall, and is provided with the same thickness as the outer lead component, on two sides of the outer lead component in plan view where the second recess is not formed.

The package and light emitting device manufacturing method pertaining to this embodiment allows a package and a light emitting device to be manufactured easily and in a thin size by injecting and curing or solidifying the resin and then cutting it away, since a resin injection opening is provided at a position that becomes unnecessary after the curing or solidifying of the resin.

DETAILED DESCRIPTION OF THE INVENTION

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Configuration of Package 100

Figure 1:
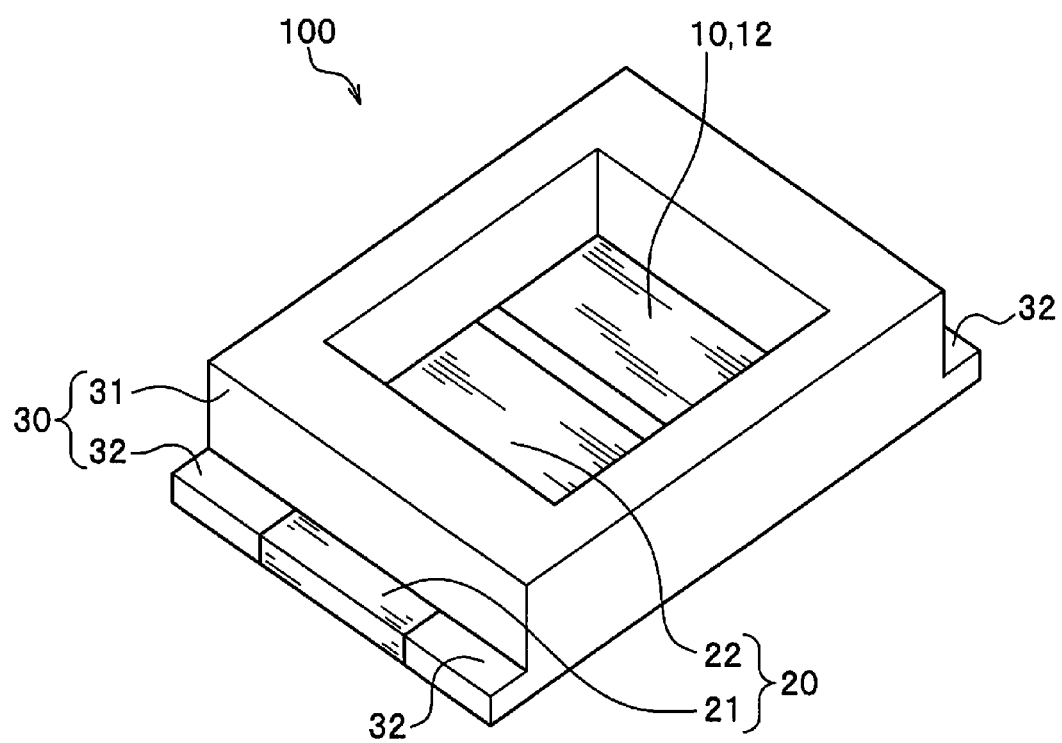
FIG. 1 is a simplified diagram of the package in an embodiment of the present invention, and is an overall oblique view of the package.
Figure 2:
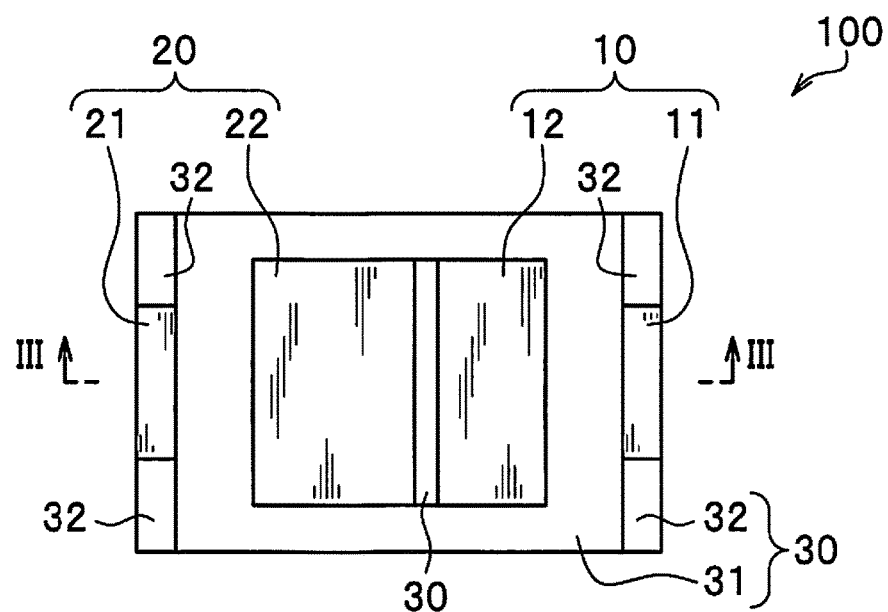
FIG. 2 is a simplified diagram of the package in an embodiment of the present invention, and is a top view of the package.
Figure 3:
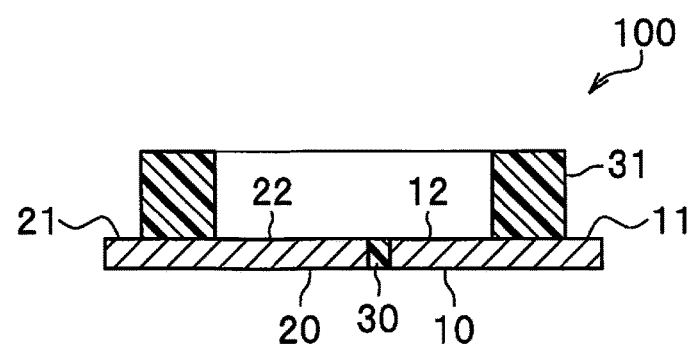
FIG. 3 is a simplified diagram of the package in an embodiment of the present invention, and is an arrow view along the III-III cross section in FIG. 2.
Figure 4:
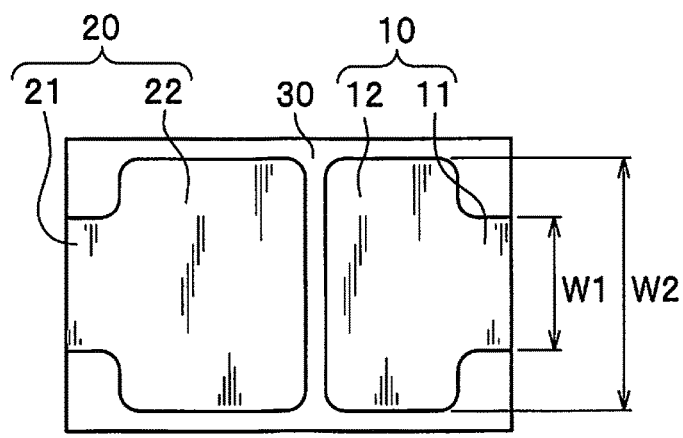
FIG. 4 is a simplified diagram of the package in an embodiment of the present invention, and is a bottom view of the package.

FIG. 1 is a simplified diagram of the package in an embodiment of the present invention, and is an overall oblique view of the package; FIG. 2 is a top view of the package in FIG. 1; FIG. 3 is an arrow view along the cross section in FIG. 2; and FIG. 4 is a bottom view of the package in an embodiment of the present invention.

The package 100 has a shape that is substantially cuboid overall, and is formed in a cup shape having a recess (cavity) on its upper surface. The package 100 has a first electrode 10, a second electrode 20, and a resin molding 30 composed of a first resin.

The first electrode 10 has a first outer lead component 11 and a first inner lead component 12. The first outer lead component 11 refers to the lead portion located on the outside of a wall 31 of the resin molding 30. The shape of the first outer lead component 11 is rectangular in plan view, but is not limited to this shape, and a cutout or recess may be provided.

The first inner lead component 12 refers to the lead portion located under the wall 31 and to the inside of the wall 31 of the resin molding 30. The shape of the first inner lead component 12 is substantially rectangular in plan view, but is not limited to this shape, and a cutout or recess may be provided. In a rear view of the package 100, the width W1 of the first outer lead component 11 exposed from the first resin is formed here to be less than the width W2 of the first inner lead component 12 exposed from the first resin.

The second electrode 20 has a second outer lead component 21 and a second inner lead component 22. The second outer lead component 21 refers to the lead portion located on the outside of the wall 31 of the resin molding 30. The shape of the second outer lead component 21 is rectangular in plan view, but is not limited to this shape, and a cutout or recess may be provided.

The second inner lead component 22 refers to the lead portion located under the wall 31 and to the inside of the wall 31 of the resin molding 30. The shape of the second inner lead component 22 is substantially rectangular in plan view, but is not limited to this shape, and a cutout or recess may be provided. In a rear view of the package 100, the width W1 of the second outer lead component 21 exposed from the first resin is formed here to be less than the width W2 of the second inner lead component 22 exposed from the first resin.

The first electrode 10 and the second electrode 20 are exposed to the outside on the bottom surface of the package 100. The outside of the bottom surface of the package 100 is the surface on the side mounted to an external substrate. The first electrode 10 and the second electrode 20 are disposed apart from each other, and the resin molding 30 is interposed between the first electrode 10 and the second electrode 20. In use as a light emitting device, the first electrode 10 and the second electrode 20 correspond to the anode and the cathode, respectively, which means that they each have a different conductivity.

The length, width, and thickness of the first electrode 10 and the second electrode 20 can be suitably selected as dictated by the intended application. The material of the first electrode 10 and the second electrode 20 is preferably copper or a copper alloy, for example, and their outermost surface is covered by a metal material with high reflectivity, such as silver or aluminum, for example.

The resin molding 30 has the wall 31 and a flange 32. The wall 31 is formed so that its four sides, which form a rectangle, are on the first electrode 10 and the second electrode 20. Also, the wall 31 is formed so that the first electrode 10 is sandwiched between two opposing sides of the rectangle, and so that the second electrode 20 is sandwiched. Consequently, the wall 31 can fix the first electrode 10 and the second electrode 20.

The wall 31 is formed so as to constitute a rectangular recess in plan view, and the shape thereof is formed as a rectangular ring in plan view. The height, length, or width of the wall 31 can be suitably selected as dictated by the intended application.

The flange 32 is formed adjacent to the first outer lead component 11 or the second outer lead component 21, and there are four flanges 32 formed here. The flanges 32 protrude to the side from the wall 31, and are formed in the same length and the same thickness as the first outer lead component 11 and the second outer lead component 21. The first outer lead component 11, the second outer lead component 21, and the flanges 32 are formed flush on both sides. As will be discussed below, in this embodiment the injection opening for the first resin is provided next to the first electrode 10, which is a position that becomes unnecessary after the curing or solidifying of the first resin, so when the first resin is injected, cured or solidified, and then cut away, a single flange 32 remains next to the first electrode 10. The resin molding 30 is equipped with four flanges 32, but the number thereof may be one or more. In case where no flange is provided, the outside surface of the wall 31 is formed flat from the top surface to the bottom surface.

Examples of the material of the resin molding 30 include thermoplastic resins and thermosetting resins.

When a thermoplastic resin is used, it can be a polyphthalamide resin, a liquid crystal polymer, polybutylene terephthalate (PBT), an unsaturated polyester, or the like, for example.

When a thermosetting resin is used, it can be an epoxy resin, a modified epoxy resin, a silicone resin, a modified silicone resin, or the like, for example.

The resin molding 30 may contain a light reflecting member in order for the light to be efficiently reflected at the inner peripheral surface of the wall 31 of the resin molding 30. This light reflecting member may be, for example, a material with high reflectivity, such as titanium oxide, a glass filler, silica, alumina, zinc oxide or another such white filler, or the like. The reflectivity of visible light is preferably at least 70%, and more preferably at least 80%. In particular, in the wavelength band in which the light emitting element emits, the reflectivity is preferably at least 70%, and more preferably at least 80%. The amount in which the titanium oxide, etc., is contained may be at least 5 wt % and no more than 50 wt %, and is preferably from 10 wt % to 30 wt %.

As described above, the package 100 can be made thinner because the resin injection opening is provided at a location that will become unnecessary after the curing or solidifying of the resin. In particular, the flanges 32 of the resin molding 30, the first electrode 10, the second electrode 20, and so forth can be made thinner than in the past. Accordingly, heat dissipation can be improved during operation of the light emitting element and so forth mounted in the package 100.

Method for Manufacturing Package 100

Figure 5:
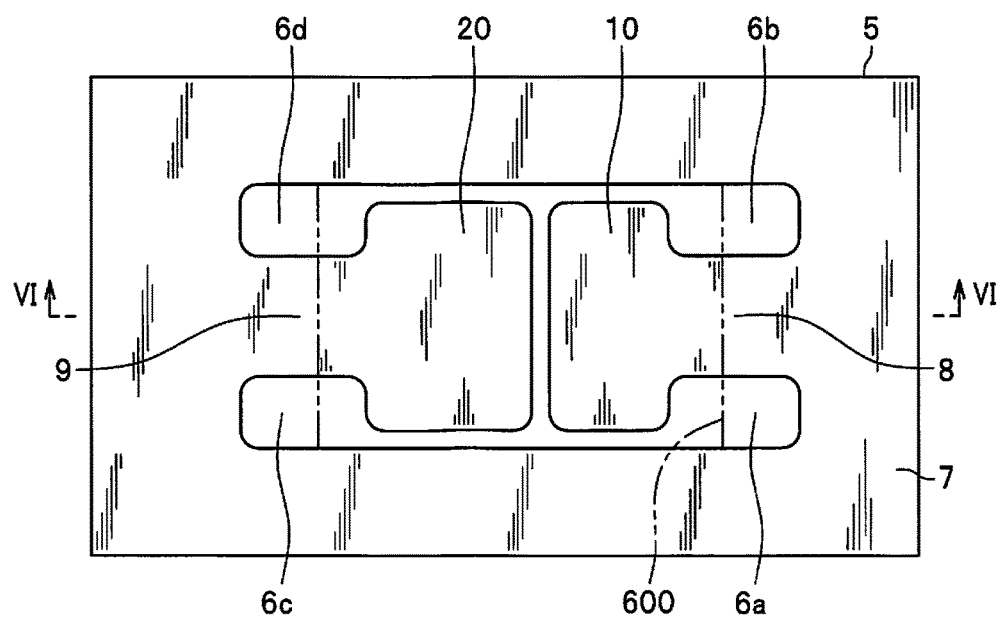
FIG. 5 is a simplified diagram of the manufacturing step of the package in an embodiment of the present invention, and is a plan view of the lead frame.
Figure 6:
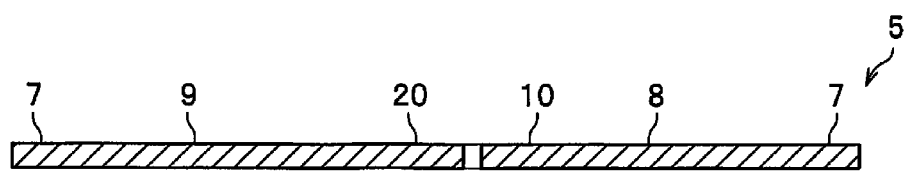
FIG. 6 is a simplified diagram of the manufacturing step of the package in an embodiment of the present invention, and is an arrow view along the VI-VI cross section in FIG. 5.
Figure 7:
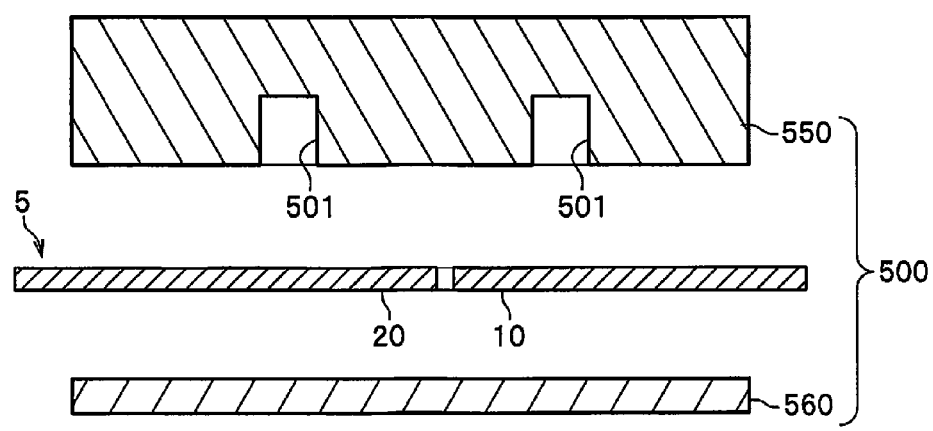
FIG. 7 is a simplified diagram of the manufacturing step of the package in an embodiment of the present invention, and is a simplified cross section of the layout of the molding dies and lead frame at positions corresponding to the X-X line in FIG. 9.
Figure 8:
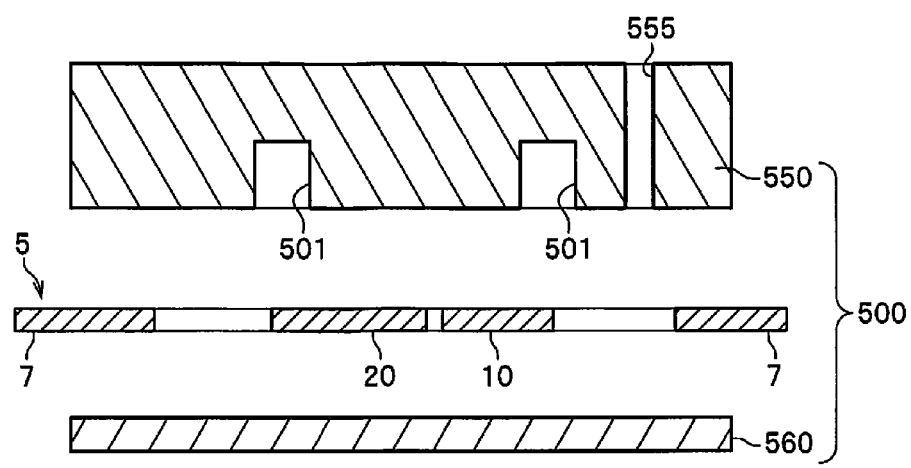
FIG. 8 is a simplified diagram of the manufacturing step of the package in an embodiment of the present invention, and is a simplified cross section of the layout of the molding dies and lead frame at positions corresponding to the XI-XI line in FIG. 9.
Figure 9:
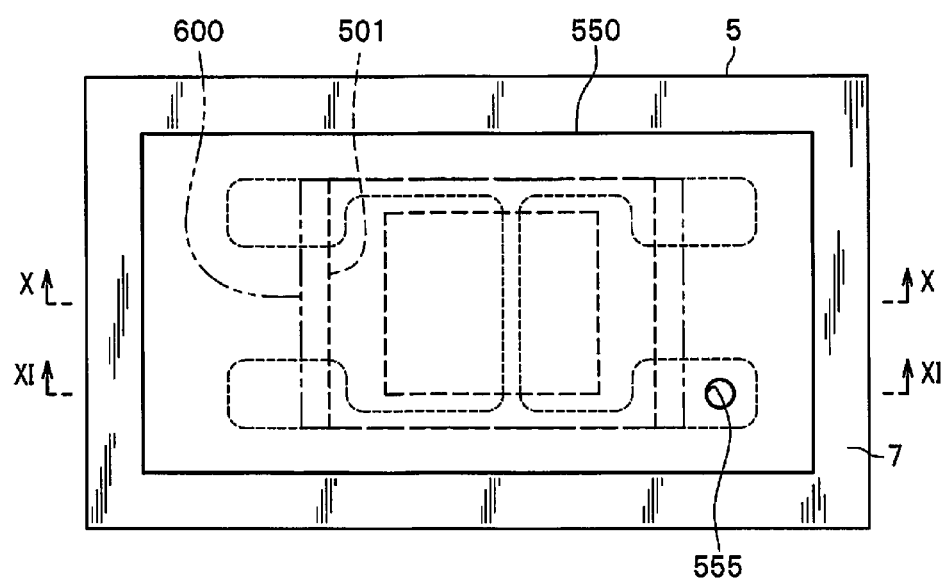
FIG. 9 is a simplified diagram of the manufacturing step of the package in an embodiment of the present invention, and is a top view of the lead frame clamped between the upper molding die and lower molding die.
Figure 10:
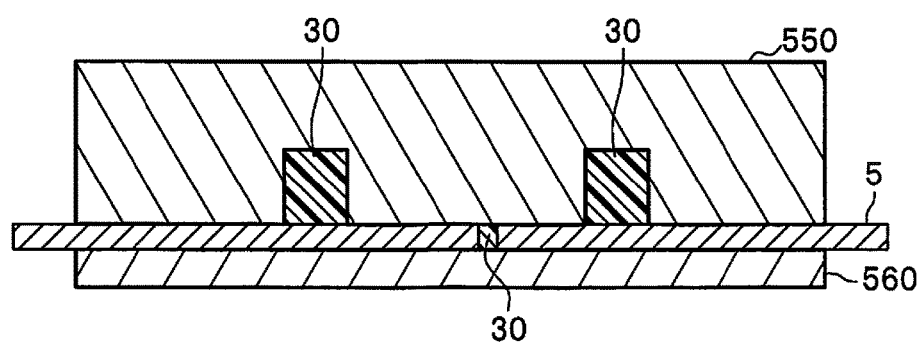
FIG. 10 is a simplified diagram of the manufacturing step of the package in an embodiment of the present invention, and is an arrow view along the X-X cross section after the injection of the first resin.
Figure 11:
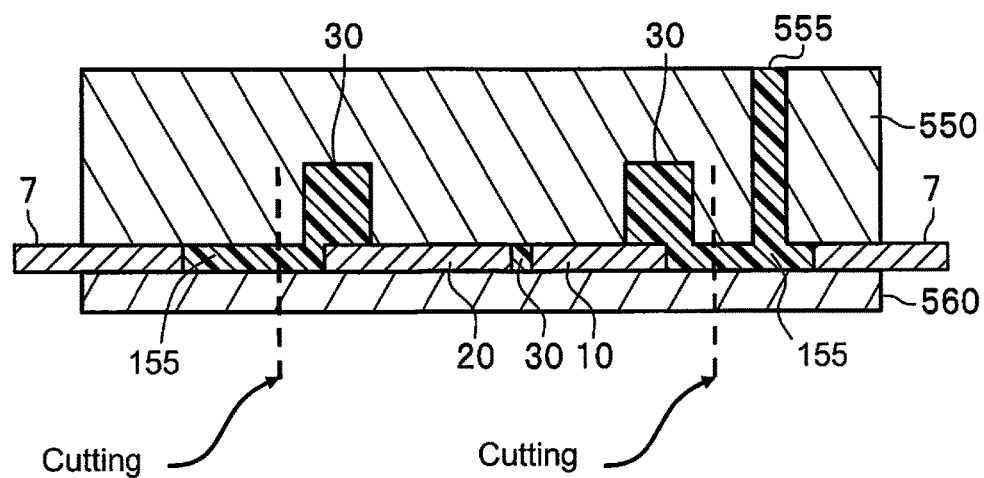
FIG. 11 is a simplified diagram of the manufacturing step of the package in an embodiment of the present invention, and is an arrow view along the XI-XI cross section after the injection of the first resin.
Figure 12:
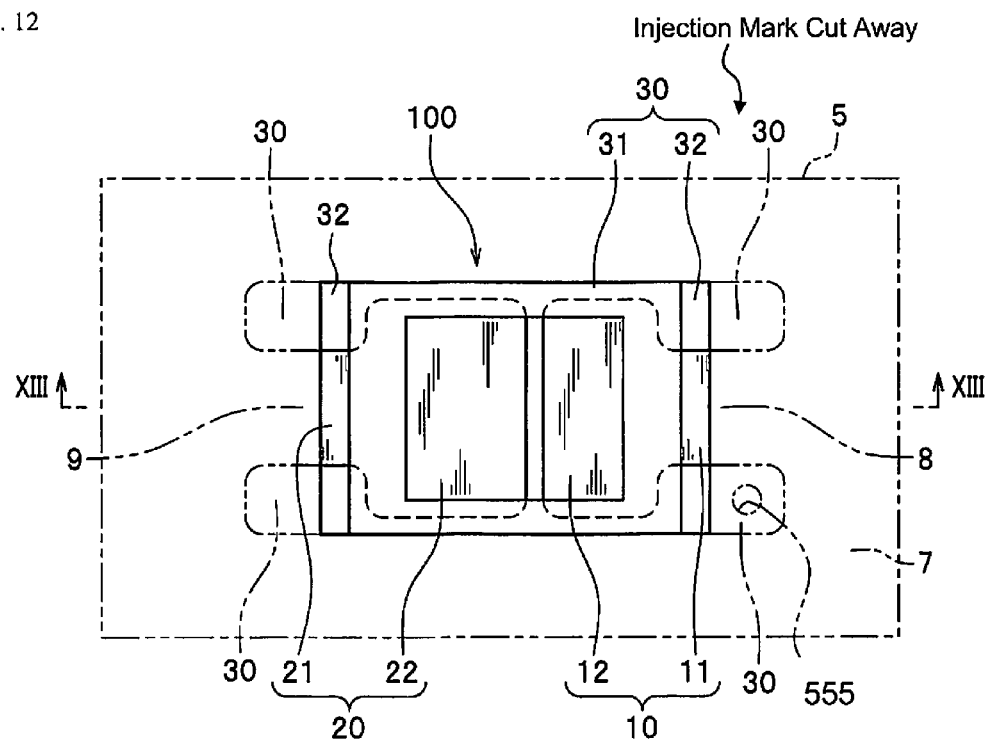
FIG. 12 is a simplified diagram of the manufacturing step of the package in an embodiment of the present invention, and is a simplified plan view of the package.
Figure 13:
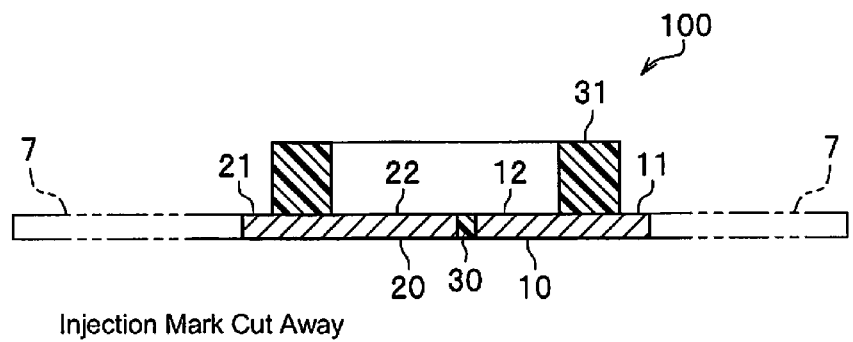
FIG. 13 is a simplified diagram of the manufacturing step of the package in an embodiment of the present invention, and is an arrow view along the XIII-XIII cross section in FIG. 12.

The method for manufacturing the package 100 will now be described through reference to FIGS. 5 to 13. FIG. 5 is a simplified diagram of the manufacturing step of the package in an embodiment of the present invention, and is a plan view of the lead frame; FIG. 6 is an arrow view along the VI-VI cross section in FIG. 5; FIG. 7 is a simplified cross section of the layout of the molding dies and lead frame at positions corresponding to the X-X line in FIG. 9; FIG. 8 is a simplified cross section of the layout of the molding dies and lead frame at positions corresponding to the XI-XI line in FIG. 9; FIG. 9 is a top view of the lead frame clamped between the upper molding die and lower molding die; FIG. 10 is an arrow view along the X-X cross section after the injection of the first resin; FIG. 11 is an arrow view along the XI-XI cross section after the injection of the first resin; FIG. 12 is a simplified plan view of the package; and FIG. 13 is an arrow view along the cross section in FIG. 12.

The method for manufacturing the package in this embodiment includes the following steps 1 to 5.

(1) Preparation of Lead Frame

In this step (1), a lead frame 5 is prepared on a flat board, part of which has been cut out. The lead frame 5 has the first electrode 10 and the second electrode 20, which is different from the first electrode 10, in a region 600 where the package is to be formed. A gap is provided between the first electrode 10 and the second electrode 20. This gap preferably has a width that is equal to or greater than the thickness of the lead frame 5. The first electrode 10 and the second electrode 20 have portions that are substantially square, and there are portions that are narrower than the width of the first electrode 10 and the width of the second electrode 20. These electrodes are linked to the outside of the region 600 where the package is to be formed. The cutting out of the lead frame 5 can be accomplished by punching, etching, or the like. The "region 600 where the package is to be formed" here is a region that becomes the outer periphery of the bottom surface of the molded package 100, which is separated from the lead frame 5. The "first electrode 10" in the lead frame 5 means the portion corresponding to the first electrode 10 after molding, and refers to a state prior to separation into individual units. Similarly, the "second electrode 20" in the lead frame 5 means the portion corresponding to the second electrode 20 after molding, and refers to a state prior to separation into individual units. For the sake of simplicity, the lead frame 5 is described as including a single region 600 where the package is to be formed, but may instead have two or more such regions.

The lead frame 5 is a flat member, has a gap portion of a specific shape around the outside of the first electrode 10 and the second electrode 20, and the portions opposite the first electrode 10 and the second electrode 20 are isolated. The lead frame 5 has a frame-shaped lead support 7 that surrounds the outside of the first electrode 10 and the second electrode 20, and suspension leads 8 and 9.

The portion of the first electrode 10 that corresponds to the first outer lead component 11 after molding is connected to the lead support 7 by the suspension lead 8. A first space 6a and a second space 6b are formed on either side of the lead frame 5 as gap components. The first space 6a and the second space 6b are formed on either side of the first electrode 10. As will be discussed below, in this embodiment the first resin is injected from the first space 6a.

The portion of the first electrode 10 that corresponds to the second outer lead component 21 is connected to the lead support 7 by the suspension lead 9. A third space 6c and a fourth space 6d are formed on either side of the lead frame 5 as gap components. The third space 6c and the fourth space 6d are formed on either side of the second electrode 20.

(2) Clamping of Lead Frame between Upper Molding Die and Lower Molding Die

In this step, the first electrode 10 and the second electrode 20 of the lead frame 5 are clamped between an upper molding die 550 and a lower molding die 560 of a molding die 500 that is divided into top and bottom. In the description that follows, the lower molding die 560 is isolated from the lower surface of the lead frame 5, but the lead frame 5 may instead be fixed to the lower molding die 560.

The upper molding die 550 of the molding die 500 has recesses 501 corresponding to the wall 31 of the resin molding 30 formed on the first electrode 10 and the second electrode 20. The first resin is injected into the recesses 501 provided to the upper molding die 550. The recesses 501 in the upper molding die 550 are linked in a ring shape. A through-hole that becomes a gate 555 is formed in the upper molding die 550 on the outside of the recesses 501 in plan view, at a different location from the recesses 501. The parts are clamped together tightly enough that the first resin will not go into the gap between the lead frame 5 and the upper molding die 550 and the lower molding die 560. In case where the first resin may go into the gap between the lead frame 5 and the upper molding die 550 and the lower molding die 560, and the resin sticks to the surface of the lead frame 5, then a de-flashing step will be necessary.

(3) Injection of First Resin into Molding Die

The upper molding die 550 of the molding die 500 is equipped with the gate 555 (injection opening) on the outside of the region 600 where the package is to be formed. The lead frame 5 is cut away at the portion corresponding to the gate 555 of the upper molding die 550. The gate 555 is formed on the lead support 7 side that becomes the outside of the first electrode 10. Here, a light reflecting member is pre-mixed into the first resin that is injected through the gate 555.

In this step, the first resin is injected through the gate 555 that is next to the first electrode 10 (the first outer lead component 11) in plan view, within the molding die 500, which clamps the lead frame 5 between the upper molding die 550 and the lower molding die 560.

The first resin injected through the gate 555 passes through the cut-out in the lead frame 5 and is injected into the recesses 501 of the upper molding die 550. The description here is of a single gate 555, but a plurality of them can be provided to the upper molding die 550. Also, the gate 555 is provided to the upper molding die 550, but can instead be provided to the lower molding die 560, so that the first resin is injected from the lower molding die 560 side.

The first resin injection step can include injection molding, transfer molding, extrusion molding, or another known molding method.

(4) Curing or Solidifying of First Resin

In this embodiment, we will assume, as an example, that the first resin is a thermosetting resin such as an epoxy resin. In this case, the injecting the first resin may be transfer molding. With transfer molding, a pellet of a specific size of a thermosetting resin (a tablet) is placed ahead of time in a specific container that is linked to the upper molding die 550.

The above-mentioned steps 2, 3, and 4 will be briefly described below, using transfer molding as an example.

With transfer molding, in the above-mentioned step 2, the lead frame 5 is fixed to the heated lower molding die 560, and is clamped between the upper molding die 550 and the lower molding die 560 that have been similarly heated. In step 3, pressure is applied by a piston, for example, to a specific container that is linked to the upper molding die 550, which causes the molten thermosetting resin (first resin) to be injected from the specific container, through the gate 555, and into the recesses 501 of the upper molding die 550. In step 4, the thermosetting resin (first resin) that has been injected is heated. The thermosetting resin that has been cured (precured) by heating becomes the resin molding 30.

In case where the first resin is a thermoplastic resin such as a polyphthalamide resin, it can be molded by injection molding. In this case, the thermoplastic resin may be heated to a high temperature and melted, then cooled solidified by being put into a low-temperature mold.

The injected first resin is thus cured or solidified, and the wall 31, which corresponds to the recesses 501 had by the upper molding die 550 of the molding die 500 (divided into top and bottom), is formed.

(5) Cutting Away Injection Mark of First Resin Injection Opening

After the first resin is cured or solidified, the injection mark from the first resin injection opening is cut away. Also, the first resin and the lead frame 5 are cut to divide the package 100 into individual units. Here, a lead cutter, for example, can be used as the tool for cutting the suspension leads 8 and 9. Of the rectangular shape of the region 600 where the package is to be formed, the right and left sides hit the resin molding 30 and the suspension leads 8 and 9 of the lead frame 5. Cut-outs that may be circular, elliptical, polyhedral, substantially polyhedral, etc., can also be provided to the lead frame 5 at the cut positions to reduce the surface area of the lead frame 5.

In this embodiment, when the package 100 is divided up from the lead frame 5, the suspension leads 8 and 9 are cut so as to match the short sides of the region 600 where the package is to be formed. After the first resin has been injected and cured or solidified, the recesses 501 of the upper molding die 550 are filled with the resin molding 30, so the end portions of the resin molding 30 are also cut at the same time.

Cutting the suspension leads 8 and 9 as above allows the gate mark (injection mark) 155 of the first resin to be cut away from next to the first electrode 10. Consequently, no gate mark is left on the surface of the package 100. The timing at which this cutting is performed may be either before the light emitting element is mounted, or after the light emitting element has been mounted. The package 100 can be manufactured by the above steps 1 to 5.

With a conventional method, the resin was injected from the back side of the package, but with the package manufacturing method in this embodiment, the resin is injected from next to the first electrode 10, on the outside of the region 600 where the package is to be formed, and the gate mark thereof is cut away, so the package can be made thinner.

Also, with the package manufacturing method in this embodiment, there is no need for a step of bending the lead as was done with a conventional package manufacturing method, so the time it took to do this bending can be saved.

With a conventional manufacturing method, for example, in case where a flat lead frame is readied, and there are a plurality of regions where the package is to be formed, arranged in a two-dimensional array, the spacing between the regions is a specific length that takes the bending of the leads into account. By contrast, with the package manufacturing method in this embodiment, since there is no need to bend the leads, there is no need to ensure that the leads are long enough to be bent. That is, the package spacing can be reduced by an amount equivalent to not having to bend the leads, and therefore more packages can be taken from the same flat lead frame than in the past, and the frame (material) can be utilized more effectively.

Configuration of Light Emitting Device 1

Figure 14:
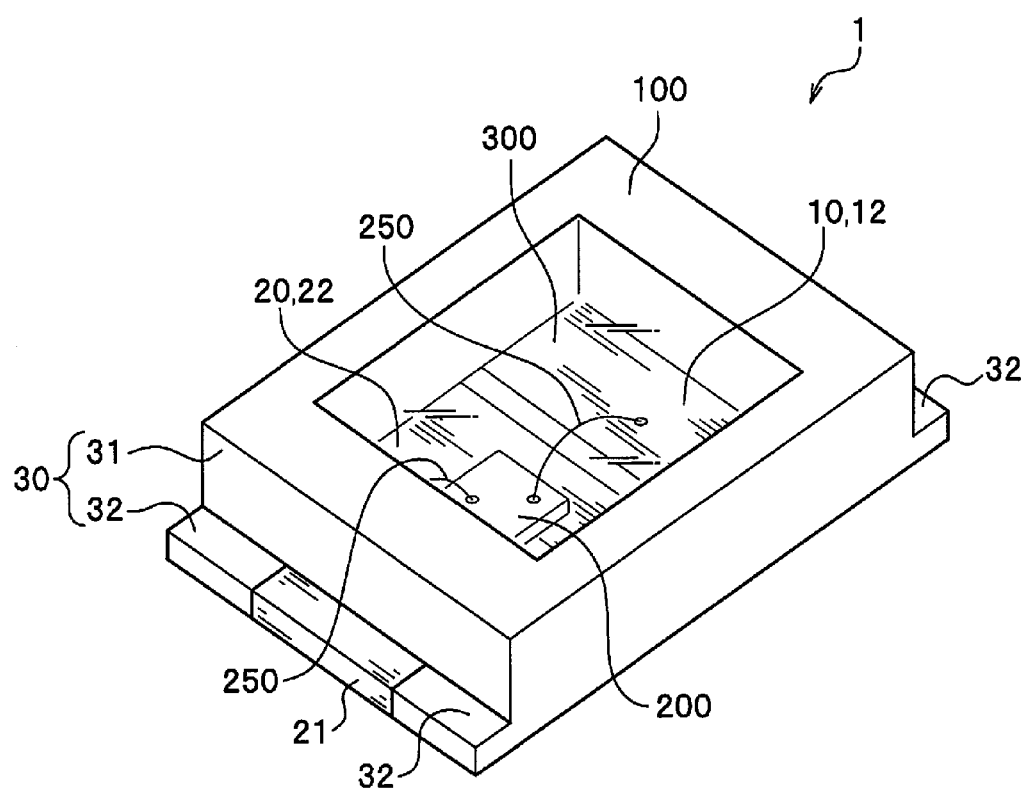
FIG. 14 is a simplified diagram of the light emitting device in an embodiment of the present invention, and is an overall oblique view of the light emitting device.

FIG. 14 is a simplified diagram of the light emitting device in an embodiment of the present invention, and is an overall oblique view of the light emitting device. As shown in FIG. 14, the light emitting device 1 has the package 100, a light emitting element 200, wires 250, and a sealing member 300 composed of a second resin. The light emitting element 200 is mounted on the second electrode 20 of the package 100. Any shape, size, etc., of the light emitting element 200 can be used here. As to the emission color of the light emitting element 200, the desired wavelength can be selected according to the application. For instance, a GaN-based or InGaN-based material can be used for a blue light emitting element (light with a wavelength of 430 to 490 nm). $In_XAl_YGa_{1-X-Y}N$ ($0 \leq X \leq 1$, $0 \leq Y \leq 1$, $X+Y \leq 1$) or the like can be used as an InGaN-based material.

The wires 250 are conductive wires for electrically connecting the first electrode 10 and the second electrode 20 to the light emitting element 200 and to a protective element or other such electronic part. Examples of the material of the wires 250 include gold, copper, platinum, aluminum, and other such metals, as well as alloys of these. The thickness of the wires 250 can be suitably selected as dictated by the intended application.

The sealing member 300 covers the light emitting element 200, etc., mounted in the package 100. The sealing member 300 protects the light emitting element 200, etc., from external force, dust, moisture, and so forth, and is also provided to improve the heat resistance, weather resistance, and light resistance of the light emitting element 200, etc. Examples of the material of the sealing member 300 include thermosetting resins, such as silicone resin, epoxy resin, urea resin, and other such transparent materials. In addition to this material, a phosphor, a substance with high optical reflectivity, or another such filler can also be contained in order to impart a specific function.

The color of the light emitting device 1 can be easily adjusted by mixing a phosphor for example, into the sealing member 300. The phosphor can be one whose specific gravity is higher than that of the sealing member 300, and which absorbs light from the light emitting element 200 to convert the wavelength. The phosphor preferably has a higher specific gravity than the sealing member 300 so that it will settle on the first electrode 10 and second electrode 20 side.

More specifically, examples include YAG ($Y_3Al_5O_{12}$:Ce), silicate, and other such yellow phosphors, and CASN (CaAlSiN$_3$:Eu), KSF ($K_2SiF_6$:Mn), and other such red phosphors.

Examples of fillers that can be contained in the sealing member 300 include $SiO_2$, $TiO_2$, $Al_2O_3$, $ZrO_2$, MgO, and other such substances with high optical reflectivity. Organic and inorganic coloring dyes and coloring pigments can be used, for example, for the purpose of cutting out wavelengths other than the one desired.

Method for Manufacturing Light Emitting Device 1

(First Method for Manufacturing Light Emitting Device)

With the first method for manufacturing the light emitting device 1, the light emitting element 200 is mounted in the package 100 before step 5 and after steps 1 to 4 (out of all the steps for manufacturing the package 100). Specifically, the light emitting element 200 is mounted on the second electrode 20 of the package 100 that has not been separated from the lead frame 5.

The light emitting element 200 is an element with a one-sided electrode structure, in which a pair of an n electrode and a p electrode are formed on the top surface. In this case, the rear surface of the light emitting element 200 is joined to the second electrode 20 with an insulating die-bond material, one of the electrodes on the top surface is connected by a wire 250 to the second electrode 20, and the other electrode on the top surface is connected by a wire 250 to the second electrode 20.

The recess surrounded by the wall 31 of the resin molding 30 of the package 100 is then coated with the sealing member 300 to seal the light emitting element 200. The sealing member 300 here is applied in drops all the way to the top surface of the recess of the resin molding 30. The method for filling the recess of the resin molding 30 with the sealing member 300 can be injection, compression, extrusion, or the like. However, dropwise application allows any air remaining in the recess of the resin molding 30 to be effectively discharged, so filling dropwise is preferable.

(Second Method for Manufacturing Light Emitting Device)

With the first method for manufacturing the light emitting device 1, the light emitting element 200 is first mounted in the package 100, and then the product is divided into individual units, but with the second manufacturing method, the light emitting element 200 may be mounted in the package 100 after all the steps for manufacturing a package 100 that has already been divided into an individual unit. Specifically, the light emitting element 200 is mounted in a package 100 that has been divided into an individual unit.

Modification Example 1

The first space 6a and the second space 6b are formed on either side of the suspension lead 8 in the lead frame 5 shown in FIG. 5, but as long as there may be one space for injecting the first resin, either the first space 6a or the second space 6b can be provided.

With the upper molding die 550 of the molding die 500 shown in FIG. 9, just the one gate 555 is formed, but two gates may be formed at positions on either side of the first electrode 10, and the first resin injected through these two gates.

Also, in addition to providing a gate next to the first electrode 10, a gate may be provided at a position or positions corresponding to one or both sides of the second electrode 20, and the first resin can be injected there.

Modification Example

The shape of the lead frame 5 shown in FIG. 5 is an example, but the first electrode 10 and the second electrode 20 may both be the same size, or they may have different shapes, for example.

Through-holes may be provided in the center of the left and right short sides of the region 600 where the package is to be formed (indicated by the rectangular imaginary line in FIG. 5. With this configuration, when the suspension leads 8 and 9 are cut, the sites of the through-holes are cut and become castellation. Therefore, when the package is soldered to an external mounting board, for example, a fillet can be observed. In addition, the service life of the blade of the lead cutter can be extended in the step of cutting the suspension leads 8 and suspension lead 9, for example.

Modification Example 3

Two of the packages 100 shown in FIG. 1 may be readied, and a double-cavity package manufactured that has a double size with a shape in which the cavities may be connected together at side surfaces having no flanges 32 of the resin molding 30. In this case, the package after molding will have two recesses (cavities) in the up and down direction in plan view. This double-cavity package allows the packages 100 to be arranged closer together and affords higher optical output.

With a double-cavity package, the package cost can be the same as when two packages 100 of different specifications are arranged closer together. For example, the recess of one resin molding can contain a phosphor, while the other recess does not. Alternatively, the recess of one resin molding can contain a first phosphor, while the other recess contains a second phosphor. The following lead frame may be prepared to manufacture this double-cavity package.

In the lead frame 5 shown in FIG. 5, the pattern shape of the gap is altered, two sets (up and down) of package elements including the first electrode 10 and the second electrode 20 are readied, the first space 6a is disposed between two suspension leads 8, and the third space 6c is disposed between two suspension leads 9. Here, the region 600 where the package is to be formed, indicated by the rectangular imaginary line in FIG. 5, is expanded in the up and down direction, and the region having the two sets of package elements serves as the region where the double-cavity package is to be formed. The recesses 501 had by the upper molding die 550 of the molding die 500 shown in FIGS. 7 and 8 is modified to correspond to the wall of the resin molding of the double-cavity package.

Modification Example 4

A double-sized single-cavity package may be manufactured by removing the wall between the two recesses of the resin molding in the double-cavity package in Modification Example 3. In this case, the package after molding has a single recess (cavity) of the resin molding, and has four inner leads in this recess. Thus, for example, three of the inner leads can serve as cathodes (second electrodes), light emitting elements corresponding to RGB can be mounted for these cathodes, and the remaining inner lead can serve as an anode (first electrode). Furthermore, a protective element may7 be mounted to the inner lead to which no light emitting element has been mounted. To manufacture a single-cavity package such as this, the recesses 501 had by the upper molding die 550 of the molding die 500 shown in FIGS. 7 and 8 may be modified to correspond to the wall of the resin molding of the single-cavity package.

Other Modification Examples

The light emitting element 200 may, for example, be an element with a counter electrode structure (double-sided electrode structure) in which an n electrode (or p electrode) is formed on the back surface of the element substrate. Also, the light emitting element 200 is not limited to being a face-up type, and may instead be a face-down type. No wires are needed when a face-down type of light emitting element is used.

The light emitting element 200 can be mounted on the first electrode 10 instead of on the second electrode 20. In case where the light emitting device 1 is equipped with two light emitting elements 200, for example, then light emitting elements 200 can be mounted on the first electrode 10 and the second electrode 20. A protective element may be mounted to the inner lead where no light emitting element has been mounted.

The plan view shape of the wall 31 of the resin molding 30 of the package 100 is not limited to the rectangular ring shape shown as an example in FIG. 1, and the shape of the wall 31 may, for example, be that of a circular ring or an elliptical ring in plan view.

Configuration of Package 100B

Figure 15:
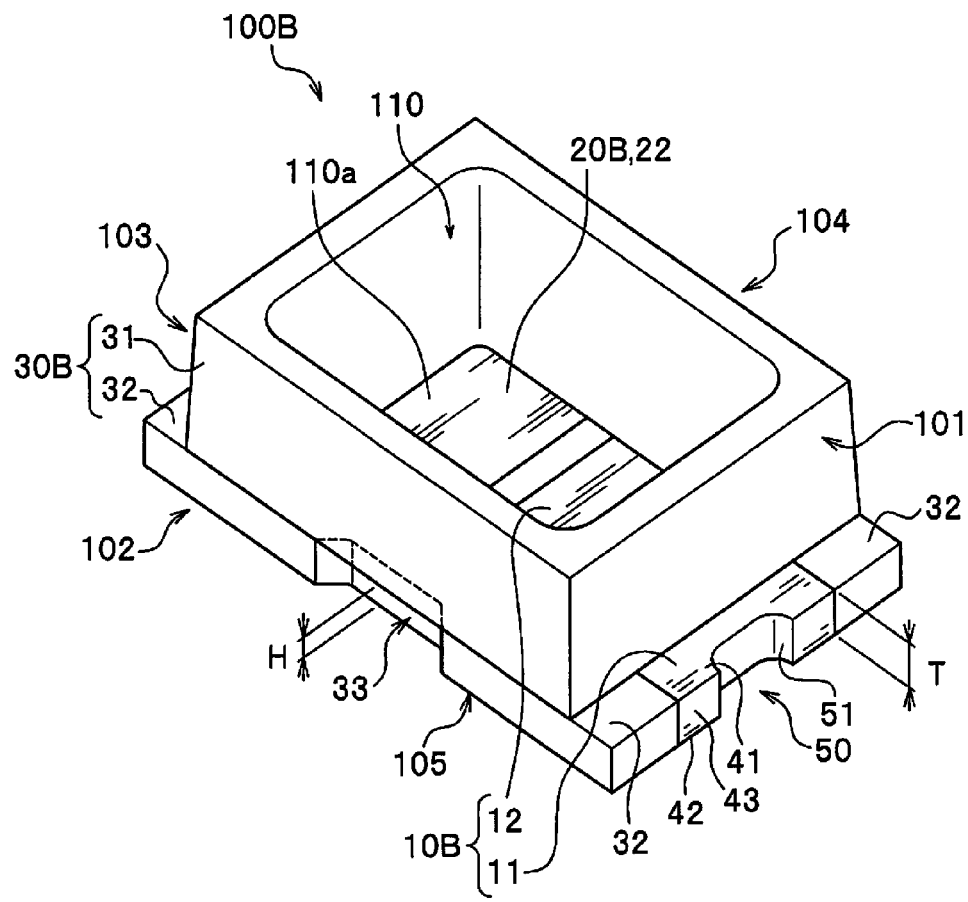
FIG. 15 is a simplified diagram of the package in another embodiment of the present invention, and is an overall oblique view of the package.

The package in Modification Example 2 will be described through reference to the drawings. FIG. 15 is a simplified view of the package pertaining to another embodiment, and is an oblique view of the overall package. Those components that are the same as in the package 100 in FIG. 1 will be numbered the same and will not be described again.

The package 100B has a bottomed concave component 110 that opens upward, a first outer surface 101 (hereinafter referred to as an "outer surface" unless otherwise specified), a second outer surface 102 that is adjacent to the first outer surface 101, a third outer surface 103 that is adjacent to the second outer surface 102 and opposite the first outer surface 101, a fourth outer surface 104 that is adjacent to the outer surface 101 and the third outer surface 103, and a bottom surface 105. Here, the bottom surface 105 serves as the mounting surface of the package 100B. This package 100B has a first electrode 10B, a second electrode 20B whose polarity is different from that of the first electrode 10B, and a resin molding 30B. These members constitute the bottom surface 105.

The first electrode 10B has a first outer lead component 11 that protrudes outward from the wall 31 in plan view (hereinafter referred to as "outward" unless otherwise specified). The first outer lead component 11 protrudes from the first outer surface 101 of the package 100B. As discussed above, a partial cut-out, recess, or through-hole may be provided to the first outer lead component 11. In view of this, in this embodiment the first outer lead component 11 has a second recess 50 at its distal end. The second recess 50 is seen in a side view of the package 100B. This allows a fillet to be formed when the second recess 50 is soldered to an external mounting board, for example.

In this embodiment, the second electrode 20B has a second outer lead component 21 that protrudes outward from the wall 31 in plan view. The second outer lead component 21 protrudes from the third outer surface 103 of the package 100B. As discussed above, a partial cut-out, recess, or through-hole may be provided to the second outer lead component 21. In view of this, in this embodiment the second outer lead component 21 has a second recess 50 at its distal end. The package 100B may have a second recess 50 in just one electrode, or it may have an outer lead component at just one electrode.

As discussed above, the outermost surfaces of the first electrode 10B and the second electrode 20B are preferably covered by a metal material with high reflectivity, such as silver or aluminum.

In view of this, in this embodiment, after a through-hole or other such gap is provided to the lead frame that is prepared in order to manufacture the package 100B, this lead frame is plated with silver, aluminum, copper, gold, or the like. The first electrode 10B and the second electrode 20B are thus plated.

With the first electrode 10B, the first outer lead component 11 the distal end surface of the first outer lead component 11 is not plated except for the side surface 51 of the second recess 50. The reason for not plating is that the side surface 43 of the first outer lead component 11 is a cross sectional surface that appears when the package 100B is cut into individual units.

On the other hand, since the upper surface 41 and the lower surface 42 of the first outer lead component 11 and the side surface 51 of the second recess 50 are plated, this improves the joint strength with the solder or other conductive member.

Similarly, with the second electrode 20B, the upper surface 41 and the lower surface 42 of the second outer lead component 21 and the side surface 51 of the second recess 50 are plated, and the distal end surface is not plated except for the side surface 51 of the second recess 50.

Also, with the package 100B, since the first inner lead component 12 of the first electrode 10B and the second inner lead component 22 of the second electrode 20B are plated, when a light emitting element is mounted to the bottomed concave component 110 of the package 100B to constitute a light emitting device, the reflectivity of light from this light emitting element can be increased.

The resin molding 30B has the wall 31 and a flange 32. The wall 31 and the flange 32 are molded integrally from the same material. Integrally molding in this way raises the strength between the wall 31 and the flange 32.

The wall 31 fixes the first electrode 10B and the second electrode 20B and also constitutes the side walls of the bottomed concave component 110. The bottomed concave component 110 has a shape that widens toward its opening. At least part of the bottom surface 110a of the bottomed concave component 110 is constituted by the first inner lead component 12 of the first electrode 10B and the second inner lead component 22 of the second electrode 20B.

The flange 32 protrudes outward from the wall 31 in plan view. The flange 32 protrudes from the first outer surface 101 of the package 100B. As discussed above, the flange 32 is provided in the same thickness T as the first outer lead component 11, on both sides of the first outer lead component 11 in plan view. This flange 32 is not provided to the second recess 50 of the first outer lead component 11.

In this embodiment, another flange 32 protrudes from the third outer surface 103 of the package 100B, and is provided in the same thickness as the second outer lead component 21, on both sides of the second outer lead component 21 in plan view. The configuration may be such that there is a flange provided on both sides of just one of the outer lead components.

With the package 100B, the first electrode 10B protrudes from the first outer surface 101, and the second electrode 20B protrudes from the third outer surface 103, but the first electrode 10B and the second electrode 20B are not exposed at the second outer surface 102 or the fourth outer surface 104. That is, the entire second outer surface 102 and the entire fourth outer surface 104 are molded from the same material as the wall 31. Accordingly, when the package 100B is soldered to an external mounting board, for example, there is less solder leakage to the second outer surface 102 and the fourth outer surface 104.

With the package 100B, part of the second outer surface 102 and the fourth outer surface 104 is recessed. A first recess 33 is formed in the lower end of the second outer surface 102, and communicates with the bottom surface 105. Another first recess 33 is formed in the lower end of the fourth outer surface 104, and communicates with the bottom surface 105. These first recesses 33 are the marks left by two hanger leads formed ahead of time in the lead frame used in the manufacture of the package 100B. When the lead frame 705 shown in FIG. 16, for example, is used in the manufacture of the package 100B, the plan view shape of the first recesses 33 is trapezoidal and the same as the shape of the hanger leads 711 and 712 shown in FIG. 16. The height of this trapezoid is equal to the length in the depth direction of the first recesses 33.

The first recesses 33 have the same thickness as the first and second outer lead components 11 and 21. Specifically, the length (height H) of the first recesses 33 in the up and down direction of the package 100B is the same as the thickness T of the first and second outer lead components 11 and 21.

Method for Manufacturing Package 100B

Figure 16:
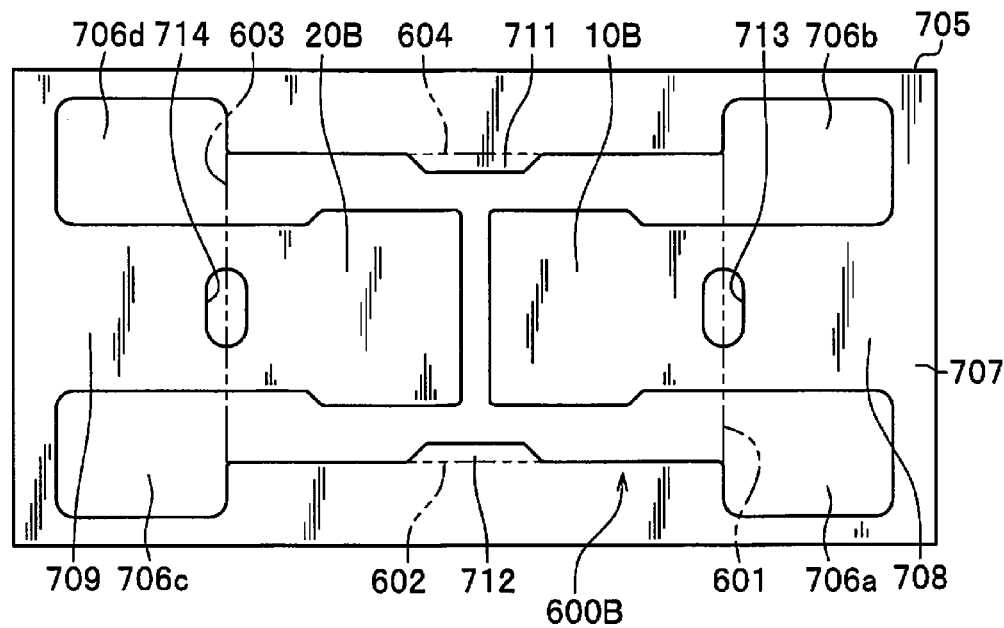
FIG. 16 is a simplified diagram of the manufacturing step of the package in another embodiment of the present invention, and is a plan view of the lead frame.
Figure 17:
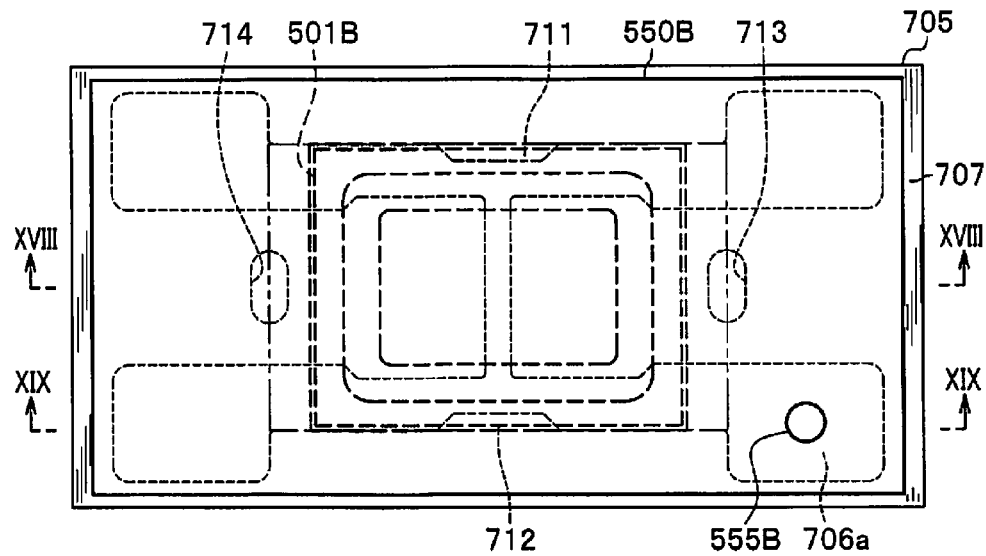
FIG. 17 is a simplified diagram of the manufacturing step of the package in another embodiment of the present invention, and is a top view of the lead frame clamped between the upper molding die and lower molding die.
Figure 18:
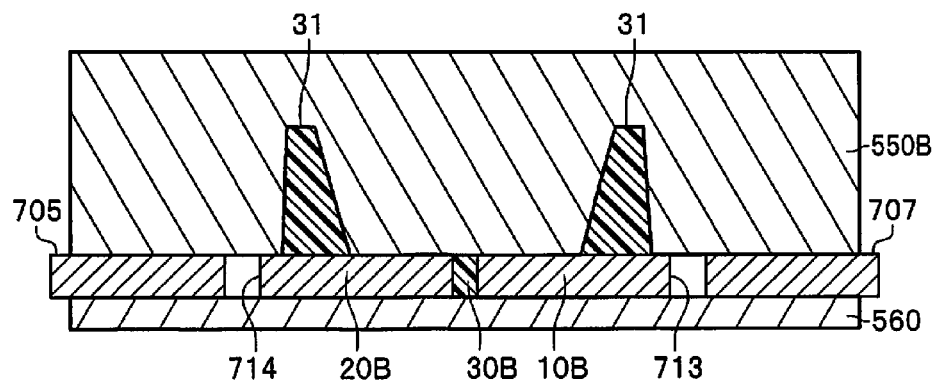
FIG. 18 is a simplified diagram of the manufacturing step of the package in another embodiment of the present invention, and is an arrow view along the XVIII-XVIII cross section in FIG. 17 after the injection of the first resin.
Figure 19:
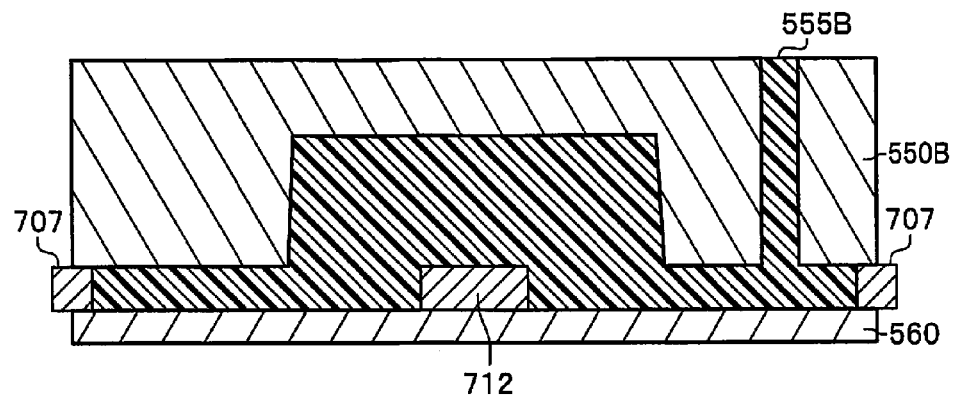
FIG. 19 is a simplified diagram of the manufacturing step of the package in another embodiment of the present invention, and is an arrow view along the XIX-XIX cross section in FIG. 17 after the injection of the first resin.

The method for manufacturing the package 100B will now be described through reference to FIGS. 16 to 19. FIG. 16 is a simplified diagram of the manufacturing step of the package in another embodiment of the present invention, and is a plan view of the lead frame; FIG. 17 is a top view of the lead frame clamped between the upper molding die and lower molding die; FIG. 18 is an arrow view along the XVIII-XVIII cross section in FIG. 17 after the injection of the first resin; and FIG. 19 is an arrow view along the XIX-XIX cross section in FIG. 17 after the injection of the first resin.

With this method for manufacturing the package 100B, the upper molding die and the lead frame that are prepared are different from those used in the manufacture of the package 100. The method for manufacturing the package in this embodiment has the following steps 1B to 5B.

(1B) Preparing the Lead Frame

In step 1B, a lead frame 705 is prepared on a flat board that has been partially cut out.

The step of preparing the lead frame 705 preferably includes a step of forming a plurality of gaps including through-holes 713 and 714 around the regions that will become the first electrode 10B and the second electrode 20B on a flat member, and a step of plating the flat member in which the plurality of gaps have been formed.

In the step of forming the gaps, they can be formed in the flat member by punching, etching, or the like.

In the step of plating, the lead frame provided with the through-holes or other such gaps is subjected to plating. More specifically, silver or the like is bonded to the lead frame by electrolytic plating.

The plated lead frame 705 has the first electrode 10B and the second electrode 20B in a region 600B where the package is to be formed, and a gap is provided between the first electrode 10B and the second electrode 20B. The region 600B where the package is to be formed here is a region that becomes the outer periphery of the bottom surface 105 of the package 100B after molding, which is separated from the lead frame 705. The "first electrode 10B" in the lead frame 705 means the portion corresponding to the first electrode 10B after molding, and refers to the state prior to separation into individual units. Similarly, The "second electrode 20B" in the lead frame 705 means the portion corresponding to the second electrode 20B after molding, and refers to the state prior to separation into individual units. For the sake of simplicity, the lead frame 705 is described as including a single region 600B where the package is to be formed, but there may be two or more of these regions.

In the lead frame 705, the region 600B where the package is to be formed is rectangular in plan view, and has a first edge 601 that is the outer edge on the first electrode 10B side out of the first electrode 10B and the second electrode 20B that are disposed opposite each other, a second edge 602 that is adjacent to the first edge 601, a third edge 603 that is adjacent to the second edge 602 and opposite the first edge 601, and a fourth edge 604 that is adjacent to the first edge 601 and the third edge 603.

The lead frame 705 is a flat member, has a gap of a specific shape surrounding the first electrode 10B and the second electrode 20B, and the portions opposite the first electrode 10B and the second electrode 20B are isolated. The lead frame 705 has a frame-shaped lead support component 707 that surrounds the first electrode 10B and the second electrode 20B, suspension leads 708 and 709, and hanger leads 711 and 712.

The lead support component 707 is a member used to support the suspension leads 708 and 709 and the hanger leads 711 and 712.

The suspension leads 708 and 709 are sites for supporting the molded package 100B in a state of being connected from both sides in one direction (the horizontal direction in FIG. 16), and are cut off of the first electrode 10B and the second electrode 20B during cutting into individual units.

The hanger leads 711 and 712 are sites for supporting the molded package 100B by sandwiching it from both sides in a direction perpendicular to the above-mentioned direction (the vertical direction in FIG. 16), and are not cut off. That is, the hanger leads 711 and 712 are not constituent elements of the package 100B separated from the lead frame 705.

More specifically, the portion of the first electrode 10B corresponding to the molded first outer lead component 11 is connected to the lead support component 707 by the suspension lead 708. A first space 706a and a second space 706b are formed as gaps on both sides of the suspension lead 708. The first space 706a and the second space 706b are formed on both sides of the first electrode 10B. In this embodiment, a first resin is injected through the first space 706a.

The portion of the second electrode 20B corresponding to the molded second outer lead component 21 is connected to the lead support component 707 by the suspension lead 709. A third space 706c and a fourth space 706d are formed as gaps on both sides of the suspension lead 709. The third space 706c and the fourth space 706d are formed on both sides of the second electrode 20B.

The first space 706a, the second space 706b, the third space 706c, and the fourth space 706d of the lead frame 705 communicate with the gaps surrounding the first electrode 10B and the second electrode 20B.

The lead frame 705 has the hanger lead 712, which protrudes in plan view from the second edge 602 to inside the region 600B where the package is to be formed, and the hanger lead 711, which protrudes from the fourth edge 604 to inside the region 600B where the package is to be formed.

The thickness of the hanger leads 711 and 712 is equal to the thickness of the lead frame 705. That is, the thickness of the hanger leads 711 and 712 is equal to the thickness T of the first and second outer lead components 11 and 21. Accordingly, the height H of the first recesses 33 of the package 100B is the same as the thickness T of the first and second outer lead components 11 and 21.

As discussed in the description of step 5 above (the step of cutting away the injection mark), a circular, elliptical, polyhedral, substantially polyhedral, or other such through-hole can be provided at the position where the lead frame is cut. In view of this, in this embodiment, the lead frame 705 has through-holes 713 and 714 at positions that span across the outer edges of the region 600B where the package is to be formed, in the first electrode 10B and/or the second electrode 20B.

More specifically, in this embodiment, the lead frame 705 has an elliptical through-hole 713 that is longer in the direction running along the first edge 601, on the first edge 601 of the region 600B where the package is to be formed. The lead frame 705 also has an elliptical through-hole 714 that is longer in the direction running along the third edge 603, on the third edge 603 of the region 600B where the package is to be formed. The inner peripheral surfaces of these through-holes 713 and 714 are also plated. The through-holes 713 and 714 are independent, and do not communicate with the first space 706a, etc.

(2B) Sandwiching Lead Frame between Upper Molding Die and Lower Molding Die

In this step, the first electrode 10B and the second electrode 20B of the lead frame 705 are sandwiched between an upper molding die 550B and a lower molding die 560 of a molding die 500 that is divided into top and bottom. The upper molding die 550B has a recess 501B that corresponds to the wall 31 of the resin molding 30B, and a flat part that is adjacent to this recess 501B. The recess 501B is linked in the form of a ring. The lead frame 705 is disposed so that the region 600B where the package is to be formed will be located under the recess 501B of the upper molding die 550B, and the through-holes 713 and 714 will be located to the outside of the recess 501B.

Also, a through-hole is formed in the upper molding die 550B that becomes a gate 555B at the position where the first space 706a is provided on the outside of the region 600B where the package is to be formed when positioned with the lead frame 705.

This positioning brings the flat part adjacent to the recess 501B of the upper molding die 550B into contact with at least part of the lead support component 707, with the suspension leads 708 and 709, and with the portions corresponding to the molded first and second outer lead components 11 and 21. At this point, the lead frame 705 is clamped tightly enough that the first resin will not work its way in between the upper molding die 550B and the lower molding die 560.

(3B) Injecting First Resin into Molding Die

In this step, the first resin is injected from the gate 555B, which is adjacent to the first electrode 10B (the first outer lead component 11) in plan view, into the molding die 500 where the lead frame 705 is clamped between the upper molding die 550B and the lower molding die 560. The first resin injected from the gate 555B goes through the first space 706a of the lead frame 705, and is injected into the recess 501B of the upper molding die 550B. Also, the first resin is injected into the second space 706b, the third space 706c, and the fourth space 706d that communicate with the first space 706a of the lead frame 705.

As discussed above, the lead frame 705 is disposed so that the through-holes 713 and 714 will be located to the outside of the recess 501B of the upper molding die 550B. Also, the lead frame 705 is clamped between the upper molding die 550B and the lower molding die 560 so that the flat part adjacent to the recess 501B of the upper molding die 550B will come into contact with the portions corresponding to the molded first and second outer lead components 11 and 21. The through-holes 713 and 714 do not communicate with the first space 706a, etc. Therefore, the first resin does not go into the through-holes 713 and 714 of the lead frame 705.

(4B) Curing or Solidifying Injected First Resin

The wall 31 and the flange 32 of the resin molding 30B are formed by the gaps other than the through-holes 713 and 714 of the lead frame 705, and by the recess 501B of the upper molding die 550B. Here, the portion corresponding to the flange 32 after molding is formed in the same thickness as the first and second outer lead components 11 and 21, adjacent to both sides of the portion corresponding to the first and second outer lead components 11 and 21 after molding. At this point, the flange 32 is contiguous to the gate 555B, but once the package 100B is separated into individual units, the flange 32 is cut away from the gate 555B.

(5B) Cutting Away Injection Mark of First Resin Injection Opening

After the first resin is cured or solidified, the injection mark from the first resin injection opening is cut away. Also, the first resin and the lead frame 705 are cut to divide the package 100B into individual units. Here, the suspension leads 708 and 709 are cut at the outer edges of the region 600B of the lead frame 705 where the package is to be formed (the first edge 601 and the third edge 603). Consequently, the through-holes 713 and 714 of the lead frame 705 are cut, and the second recess 50 is formed in the first and second outer lead components 11 and 21. Also, in separation into individual units, even when the first electrode 10B and the second electrode 20B are cut away from the lead frame 705, since the package 100B is clamped between the hanger leads 711 and 712, the package 100B will not come loose.

The package 100B can be manufactured by the above steps 1B to 5B.

With the package 100B configured as above, the flange 32 is provided in the same thickness T as the first and second outer lead components 11 and 21 on both sides of the first and second outer lead components 11 and 21 in plan view. Also, the second recess 50 is provided to the first outer lead component 11 and the second outer lead component 21.

The second recess 50 is formed by cutting the prepared lead frame 705 at locations passing through the through-holes 713 and 714. Since the end surface exposed by cutting the lead frame 705 is not plated, solder or another such conductive member will not adhere or contribute to joining.

On the other hand, in the step of injecting the first resin during manufacture, the first resin does not flow into the through-holes 713 and 714 of the lead frame 705, and the plating remains intact on the inner peripheral surfaces of the through-holes 713 and 714. Thus, the package 100B has better joint strength of the solder or other conductive member than when there is no second recess 50.

Also, since the side surface 51 of the second recess 50 is not plated in the package 100B, as discussed above, a fillet can be observed when the second recess 50 of the package 100B is soldered or otherwise joined to an external mounting board.

Further, with the package 100B, since the upper surface 41 and lower surface 42 of the first outer lead component 11 and the second outer lead component 21 are plated, the solder or other conductive member joins from the side surface 51 of the second recess 50 to the upper surface 41 and lower surface 42, and a castellation electrode can be formed.

Configuration of Light Emitting Device 1C

Figure 20:
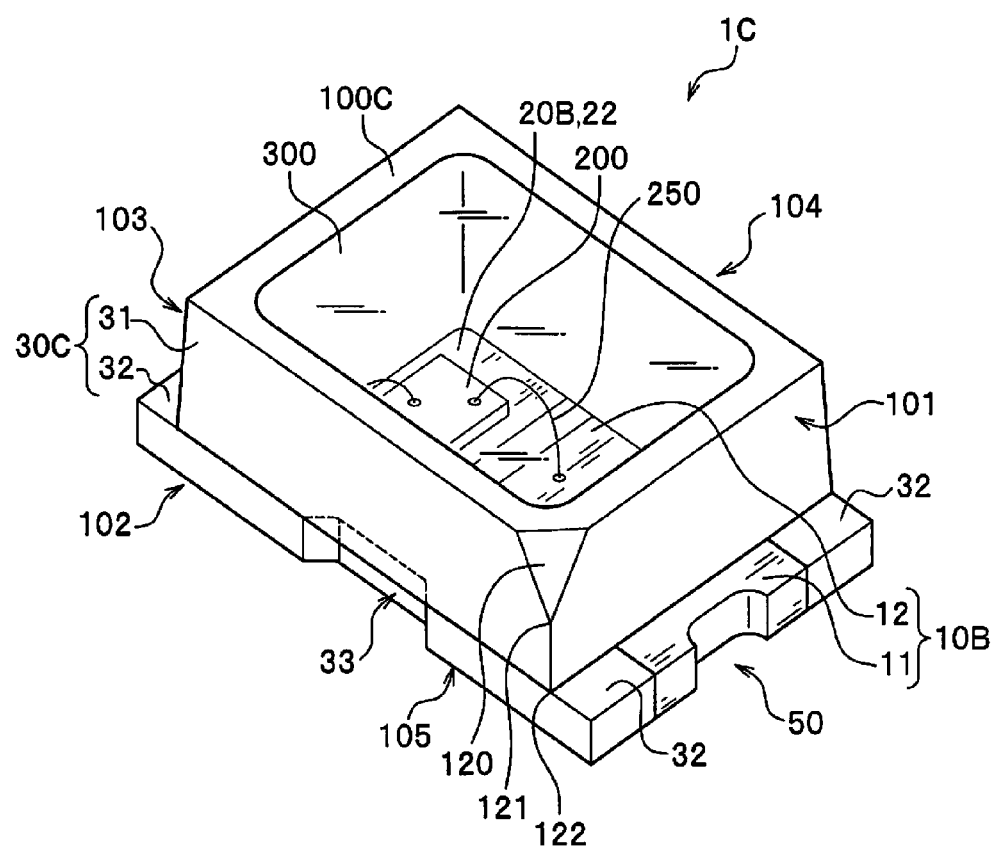
FIG. 20 is a simplified diagram of the light emitting device in another embodiment of the present invention, and is an overall oblique view of the light emitting device.

FIG. 20 is a simplified diagram of the light emitting device in another embodiment of the present invention, and is an overall oblique view of the light emitting device.

The light emitting device 1C differs from the light emitting device 1 in FIG. 14 in the use of the package 100C. Those components that are the same as in the light emitting device 1 in FIG. 14 will be numbered the same and will not be described again.

The package 100C differs from the package 100B in the shape of a resin molding 30C. The resin molding 30C has the wall 31 and the flange 32, and is equipped with a cut-out 120 at one of the vertices of the wall 31. This cut-out 120 expresses the polarity of the first electrode 10B, and is utilized as a cathode mark or an anode mark. The shape and size of the cut-out 120 can be determined as desired. Here, the cut-out 120 is in the form of an inverted triangle, and is formed spanning across the first outer surface 101 and the second outer surface 102.

The method for manufacturing the package 100C is the same as the method for manufacturing the package 100B, and therefore will not be described again. As to the cut-out 120, it can be manufactured by modifying the molding die 500 for manufacturing the package 100B so that the shape of the recess 501B of the upper molding die 550B in FIG. 17, for example, matches the wall 31 of the resin molding 30C.

The method for manufacturing the light emitting device 1C is the same as the method for manufacturing the light emitting device 1, and therefore will not be described again.

With the package 100C in FIG. 20, the end point 121 of the cut-out 120, for example, may be made more prominent by extending the cut-out 120 to the intersection 122 between the wall 31 and the flange 32, and thereby making it larger.

Also, with the light emitting device 1C, the package 100B may be used in place of the package 100C.

INDUSTRIAL APPLICABILITY

The light emitting device of the present invention can be used for various kinds of lighting fixtures, and automotive application.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A package comprising:
a first electrode and a second electrode whose polarity is different from that of the first electrode, and at least one of the first electrode and the second electrode has an outer lead component defining a recess that is recessed from a distal end surface of the outer lead component in plan view, an inner surface of the recess being plated and the distal end surface of the outer lead component being not plated;
a wall that fixes the first electrode and the second electrode, constitutes a side wall of a bottomed concave component in which at least part of a bottom surface of the bottomed concave component is constituted by the first electrode and the second electrode, and has the outer lead component protruded therefrom; and
a flange that protrudes outward from the wall on two sides of the outer lead component in plan view, a thickness of the flange being the same as a thickness of the outer lead component, wherein
a height of the wall above an upper surface of the flange is greater than the thickness of the outer lead component.

2. The package according to claim 1, wherein
an upper surface and a lower surface of the outer lead component are plated.

3. The package according to claim 1, wherein
the wall defines a first outer surface, a second outer surface that is adjacent to the first outer surface, a third outer surface that is adjacent to the second outer surface and opposite the first outer surface, and a fourth outer surface that is adjacent to the first outer surface and the third outer surface,
the outer lead component of the first electrode protrudes from the first outer surface,
the second electrode is provided on a side of the third outer surface and opposites the first electrode, and
part of the second outer surface and the fourth outer surface is recessed to define a recessed part.

4. The package according to claim 3, wherein
the recessed part of the second outer surface and the fourth outer surface is provided with the same thickness as the outer lead component.

5. The package according to claim 4, wherein
the first electrode and the second electrode are not exposed at the second outer surface or the fourth outer surface.

6. The package according to claim 3, wherein
the recessed part has a trapezoidal shape in plan view.

7. The package according to claim 1, wherein
the wall and the flange are constituted by a resin molding made of thermoplastic resin or thermosetting resin.

8. The package according to claim 1, wherein
the wall and the flange are constituted by a resin molding containing a light reflecting member.

9. The package according to claim 1, wherein
the wall and the flange are constituted by a resin molding with a reflectivity of visible light of at least 70%.

10. A light emitting device comprising
the package according to claim 1, and
a light emitting element mounted on at least one of the first electrode and the second electrode of the package.

11. The light emitting device according to claim 10, wherein
the light emitting element is covered by a resin.

12. The package according to claim 1, wherein
the wall has a cut-out at one of vertices of the wall.

13. The package according to claim 1, wherein
the at least one of the first electrode and the second electrode further has an inner lead component continuous with the outer lead component with the inner lead component constituting the at least part of the bottom surface of the bottomed concave component, the inner lead component and the outer lead component are continuously exposed at a bottom surface of the package, with a width of the outer lead component between a pair of side surfaces of the outer lead component being smaller than a width of the inner lead component between a pair of side surfaces of the inner lead component in the plan view, and a transition between the side surfaces of the inner lead component and the side surfaces of the outer lead component, respectively, is defined at least partially by a pair of transitional surfaces extending non-perpendicularly with respect to the side surfaces of the inner lead component in the plan view.

14. The package according to claim 1, wherein the at least one of the first electrode and the second electrode further has an inner lead component continuous with the outer lead component with the inner lead component constituting the at least part of the bottom surface of the bottomed concave component, the inner lead component and the outer lead component are continuously exposed at a bottom surface of the package, with a width of the outer lead component between a pair of side surfaces of the outer lead component being smaller than a width of the inner lead component between a pair of side surfaces of the inner lead component in the plan view, and a transition between the side surfaces of the inner lead component and the side surfaces of the outer lead component, respectively, is defined by a pair of transitional surfaces, with each of the transitional surfaces being continuous with a corresponding one of the side surfaces of the inner lead component and a corresponding one of the side surfaces of the outer lead component, and each of the transitional surfaces being slanted with respect to the corresponding one of the side surfaces of the inner lead component in the plan view.

* * * * *